United States Patent
DenBaars et al.

(10) Patent No.: US 8,829,546 B2
(45) Date of Patent: *Sep. 9, 2014

(54) RARE EARTH DOPED LAYER OR SUBSTRATE FOR LIGHT CONVERSION

(75) Inventors: Steven P. DenBaars, Goleta, CA (US); Eric J. Tarsa, Goleta, CA (US); Michael Mack, Santa Barbara, CA (US); Bernd Keller, Goleta, CA (US); Brian Thibeault, Santa Barbara, CA (US); Adam W. Saxler, Durham, NC (US)

(73) Assignee: Cree, Inc., Goleta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/353,647

(22) Filed: Feb. 13, 2006

(65) Prior Publication Data
US 2007/0120129 A1    May 31, 2007

Related U.S. Application Data

(63) Continuation-in-part of application No. 09/528,262, filed on Mar. 17, 2000, now Pat. No. 7,202,506.

(60) Provisional application No. 60/166,444, filed on Nov. 19, 1999.

(51) Int. Cl.
| | | |
|---|---|---|
| *H01L 33/02* | (2010.01) | |
| *H01L 33/08* | (2010.01) | |
| *H01L 33/30* | (2010.01) | |
| *H01L 33/46* | (2010.01) | |
| *H01S 5/40* | (2006.01) | |
| *H01L 33/34* | (2010.01) | |
| *H01L 27/15* | (2006.01) | |
| *H01L 33/50* | (2010.01) | |
| *H01L 25/075* | (2006.01) | |

(52) U.S. Cl.
CPC ............. *H01L 33/08* (2013.01); *H01L 33/465* (2013.01); *H01S 5/4087* (2013.01); *H01L 33/343* (2013.01); *H01L 27/15* (2013.01); *H01L 33/502* (2013.01); *H01L 33/025* (2013.01); *H01S 5/405* (2013.01); *H01L 25/0756* (2013.01); *H01L 33/30* (2013.01)
USPC ............................................ 257/98; 257/103

(58) Field of Classification Search
CPC ....................................................... H01L 33/502
USPC ....................................................... 257/70, 79
See application file for complete search history.

(56) References Cited

U.S. PATENT DOCUMENTS

| 4,946,547 A | 8/1990 | Palmour et al. ................. 117/97 |
|---|---|---|
| 4,992,302 A | 2/1991 | Lindmayer ..................... 427/70 |

(Continued)

FOREIGN PATENT DOCUMENTS

| DE | 3315675 A | 11/1983 |
|---|---|---|
| DE | 9013615 U | 12/1990 |

(Continued)

OTHER PUBLICATIONS

Nicha Corp Part Specification, *High Brightness LEDs*, (May 1999), pp. 1-3. (NSPW 300BS, NSPW).

(Continued)

*Primary Examiner* — Jerome Jackson, Jr.
*Assistant Examiner* — Christopher Culbert
(74) *Attorney, Agent, or Firm* — Koppel, Patrick, Heybl & Philpott

(57) ABSTRACT

A solid state light emitting device comprising an emitter structure having an active region of semiconductor material and a pair of oppositely doped layers of semiconductor material on opposite sides of the active region. The active region emits light at a predetermined wavelength in response to an electrical bias across the doped layers. An absorption layer of semiconductor material is included that is integral to said emitter structure and doped with at least one rare earth or transition element. The absorption layer absorbs at least some of the light emitted from the active region and re-emits at least one different wavelength of light. A substrate is included with the emitter structure and absorption layer disposed on the substrate.

24 Claims, 9 Drawing Sheets

(56) References Cited

U.S. PATENT DOCUMENTS

| | | | |
|---|---|---|---|
| 5,200,022 A | 4/1993 | Kong et al. | 117/95 |
| 5,290,393 A | 3/1994 | Nakamura | 117/509 |
| RE34,861 E | 2/1995 | Davis | |
| 5,393,993 A | 2/1995 | Edmond et al. | 257/77 |
| 5,523,589 A | 6/1996 | Edmond et al. | 257/77 |
| 5,684,309 A * | 11/1997 | McIntosh et al. | 257/191 |
| 5,686,738 A | 11/1997 | Moustakas | 257/103 |
| 5,701,035 A * | 12/1997 | Teraguchi | 257/747 |
| 5,739,554 A | 4/1998 | Edmond et al. | 257/103 |
| 5,757,026 A * | 5/1998 | Forrest et al. | 257/40 |
| 5,813,753 A | 9/1998 | Vriens et al. | 362/293 |
| 5,898,185 A | 4/1999 | Bojarczuk, Jr. et al. | 257/103 |
| 5,952,681 A | 9/1999 | Chen | 257/89 |
| 5,959,316 A | 9/1999 | Lowery | 257/98 |
| 6,015,719 A * | 1/2000 | Kish et al. | 438/29 |
| 6,093,941 A | 7/2000 | Russell et al. | 257/103 |
| 6,155,699 A * | 12/2000 | Miller et al. | 362/293 |
| 6,166,489 A | 12/2000 | Thompson et al. | 313/506 |
| 6,212,213 B1 | 4/2001 | Weber et al. | 372/50 |
| 6,239,901 B1 * | 5/2001 | Kaneko | 359/326 |
| 6,255,669 B1 | 7/2001 | Birkhahn et al. | 257/89 |
| 6,337,536 B1 | 1/2002 | Matsubara et al. | 313/498 |
| 6,576,933 B2 * | 6/2003 | Sugawara et al. | 257/103 |
| 6,747,406 B1 | 6/2004 | Bortscheller et al. | 313/512 |
| 6,841,001 B2 | 1/2005 | Saxler | 117/84 |
| 6,853,658 B1 * | 2/2005 | DiJaili et al. | 372/38.1 |
| 7,009,215 B2 * | 3/2006 | D'Evelyn et al. | 257/98 |
| 7,061,113 B2 * | 6/2006 | Fujiwara et al. | 257/758 |
| 7,084,436 B2 * | 8/2006 | DenBaars et al. | 257/101 |
| 7,223,998 B2 * | 5/2007 | Schwach et al. | 257/86 |
| 2002/0003233 A1 | 1/2002 | Mueller-Mach et al. | |
| 2002/0139968 A1 * | 10/2002 | Kondo et al. | 257/10 |
| 2002/0139984 A1 * | 10/2002 | Sugawara et al. | 257/79 |
| 2004/0041161 A1 * | 3/2004 | Kim | 257/80 |
| 2004/0222411 A1 * | 11/2004 | Atanackovic et al. | 257/34 |
| 2005/0001227 A1 * | 1/2005 | Niki et al. | 257/98 |
| 2005/0206312 A1 * | 9/2005 | Cho | 313/506 |

FOREIGN PATENT DOCUMENTS

| | | | |
|---|---|---|---|
| DE | 19645035 | 4/1998 | |
| EP | 0486052 A | 5/1992 | |
| JP | 05152609 A | 6/1993 | |
| JP | 08007614 A | 1/1996 | |
| JP | 10056203 | 2/1998 | H01L 33/00 |
| JP | 2002118292 | 4/2002 | |
| JP | 2002-208730 | 7/2002 | |
| JP | 2002-232008 | 8/2002 | |
| JP | 2005-259864 | 9/2005 | |
| WO | WO 9750132 A | 12/1997 | |
| WO | WO 0065666 A | 11/2000 | |
| WO | WO 0124284 A | 4/2001 | |
| WO | WO 0137351 A | 5/2001 | |
| WO | WO 02073758 A | 9/2002 | |

OTHER PUBLICATIONS

Prentice Hall, *Laser Electronics 2$^{nd}$ Edition*, J.T. Verdeyen, p. 363 (1989).
Patent Abstracts of Japan, vol. 017, No. 542 (E-1441), Sep. 29, 1993.
Patent Abstracts of Japan, vol. 096, No. 005, May 31, 1996.
Notice of Reasons for Rejection of counterpart Japanese Patent Application No. 2008-555243 dated Aug. 22, 2011.
Official Action from European Patent Appl. No. 07716922.5 dated Jan. 24, 2013.
International Preliminary Report on Patentability for counterpart PCT Patent Application No. PCT/US07/01731 dated Nov. 21, 2009.
Decision of Rejection from Japanese Patent Application No. 2011-002499, dated Dec. 16, 2013.
Office Action from U.S. Appl. No. 10/461,561, dated Feb. 3, 2014.

\* cited by examiner

RARE EARTH DOPED LAYER OR SUBSTRATE FOR LIGHT CONVERSION

This application is a continuation-in-part of U.S. patent application Ser. No. 09/528,262 filed on Mar. 17, 2000, now U.S. Pat. No. 7,202,506 which claims the benefit of U.S. provisional application No. 60/166,444 to Denbaars et al., filed on Nov. 19, 1999.

BACKGROUND OF THE INVENTION

1. Field of the Invention

This invention relates to solid state light emitting diodes (LEDs) and lasers that can emit various colors of light, including white.

2. Description of the Related Art

Light emitting diodes (LEDs) are a known class of solid state devices that convert electric energy to light. They generally comprise one or more active layers of semiconductor material sandwiched between oppositely doped layers. When a bias is applied across the doped layers, holes and electrons are injected into the active layer where they recombine to generate light. Light is emitted omnidirectionally from the active layer and from all surfaces of the LED. The useful light is generally emitted in the direction of the LED's top surface, which is usually p-type.

One disadvantage of conventional LEDs is that they cannot generate white light from their active layers. One way to produce white light from conventional LEDs is to combine different colors from different LEDs. For example, the light from red, green and blue LEDs, or blue and yellow LEDs can be combined to produce white light. One disadvantage of this approach is that it requires the use of multiple LEDs to produce a single color of light, increasing costs. In addition, different colors of light are often generated from different types of LEDs which can require complex fabrication to combine in one device. The resulting devices can also require complicated control electronics since the different diode types can require different control voltages. Long term wavelength and stability of these devices is also degraded by the different aging behavior of the different LEDs.

Light from a blue emitting LED can be converted to white light by surrounding the LED with a yellow phosphor, polymer or dye. [See Nichia Corp. white LED, Part No. NSPW300BS, NSPW312BS, etc., which comprise blue LEDs surrounded by a yellow phosphor powder; see also U.S. Pat. No. 5,959,316 to Hayden, entitled Multiple Encapsulation of Phosphor-LED Devices.] The surrounding material "downconverts" the wavelength of some of the LED light, changing its color. For example, if a nitride based blue emitting LED is surrounded by a yellow phosphor, some of the blue light passes through the phosphor without being changed while the remaining light is downconverted to yellow. The LED emits both blue and yellow light, which combine to produce white light.

The addition of the phosphor can result in a complex LED that requires a complex manufacturing process. In addition, the net light emitting efficiency is reduced due to the absorption in the phosphor and the Stokes shift from blue to yellow. Other examples of LEDs using this approach include U.S. Pat. No. 5,813,753 to Vriens et al., and U.S. Pat. No. 5,959,316 to Lowery.

Recent advances in nitride based LEDs have resulted in highly efficient blue light sources, and their efficiency is expected to surpass filament (and flourescent) based light sources. However, conventional blue LEDs operate from a relatively low supply current that results in a light that can be too dim for many lighting applications. This problem is compounded by the absorption of some of the blue light by the downconverting material used in generating white light from a blue source. For blue LEDs to provide a bright enough light source for room illumination, the current applied to the LED must be increased from the conventional 20-60 mAmps to 0.8-1 Amp. At this current, LEDs become very hot and any material surrounding the LED will also become hot. The heat can damage the downconverting material surrounding the LED, degrading its ability to downconvert the LED's light. The heat can also present a danger of burning objects that are near or in contact with the LED.

Conventional LEDs also only emit one color of light and in conventional multi-color LED displays, different LEDs must be included to generate different colors of light. In applications such as displays or television screens, this can result in a prohibitive number of LEDs and can require complex control electronics.

Solid state lasers convert electrical energy to light in similar fashion compared to LEDs. [Prentice Hall, *Laser Electronics* $2^{nd}$ *Edition*, J. T. Verdeyen, Page 363 (1989)]. They are structurally similar to LEDs but have mirrors on two opposing surfaces. In the case of edge emitting lasers the mirrors are on the device's side surfaces and reflect light generated by the active layer allowing a small fraction to escape from the side of the laser, through one of the mirrors. This results in a highly collimated/coherent light source. A vertical cavity laser works much the same as an edge emitting laser, but the mirrors are on the top and the bottom. Light from the active layer reflects between the mirrors, providing a similar collimated light source from the laser's top surface.

SUMMARY OF THE INVENTION

The present invention provides new LEDs and solid state lasers wherein at least one layer is doped with an element that absorbs light emitted from the active region and emits another color of light. In one embodiment, the active layers of the LED/laser are grown on substrates doped with one or more rare earth or transition element. In another embodiment, the LED/laser comprises an absorption layer of semiconductor material that can also be doped with one or more rare earth or transition element. The new LED/lasers rely on the light absorption and emission properties of the doped substrate or absorption layer to produce new colors of light. In LEDs having multiple emitting layers, or absorption layers doped with more than one element, the supply current can be manipulated such that a single LED can produce more than one color. One particular advantage of the invention is that it can provide a new white light emitting LED.

The new LED can have one or more active layers that emit light omnidirectionally, with some of the light emitting from the LED's surface and some of it passing into its doped substrate or absorption layer. Depending on the type of dopant, light within a limited range of wavelengths is absorbed. A light within this absorption range pumps the electrons on the dopant ions to a higher energy state. The pumped electrons are drawn back to their natural equilibrium state and emit energy as light at a wavelength that depends upon the type of dopant ion. Light is emitted omnidirectionally, including through the surface of the LED. The wavelength of light emitted from the dopant ion is typically different than that emitted by the active layers, effectively changing the color of light emitted from the overall device.

One embodiment of a solid state light emitting device according to the present invention comprises an emitter structure having an active region of semiconductor material and a pair of oppositely doped layers of semiconductor material on opposite sides of the active region. The active region emits light at a predetermined wavelength in response to an electrical bias across the doped layers. An absorption layer of semiconductor material is included that is integral to said emitter structure and doped with at least one rare earth or transition element. The absorption layer absorbs at least some of the light emitted from the active region and re-emits at least one different wavelength of light. A substrate is included with the emitter structure and absorption layer disposed on the substrate.

These and other further features and advantages of the invention will be apparent to those skilled in the art from the following detailed description, taken together with the accompanying drawings, in which:

DETAILED DESCRIPTION OF THE INVENTION

Figure 1:
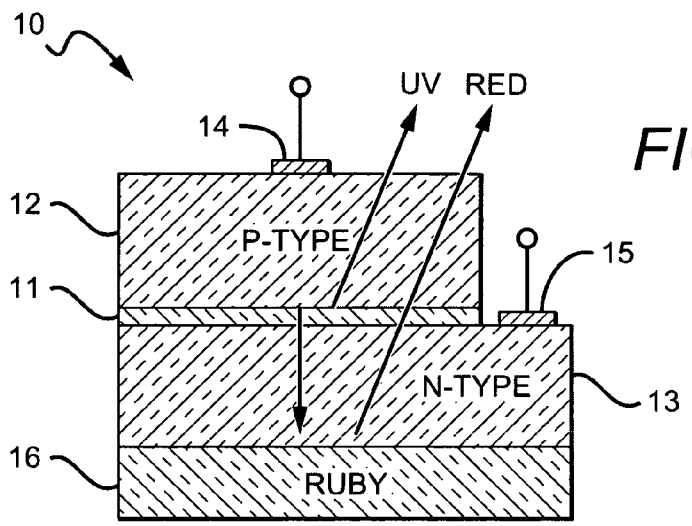
FIG. 1 is a sectional view of one embodiment of an LED according to the present invention grown on a ruby substrate and having a UV emitting active layer.

FIG. 1 shows a single active layer nitride based LED 10 constructed in accordance with the invention. It has an InGaN active layer 11 which emits UV light, sandwiched between two oppositely doped GaN layers 12 and 13. The top layer 12 is usually p-type GaN and bottom layer 13 is usually n-type GaN although the new LED would also work if the layers were reversed. The p-type layer and n-type layers have respective ohmic contacts 14 and 15, each having a lead to apply a bias across the active layer 11, causing it to emit light omnidirectionally. The entire LED can be grown on a sapphire ($Al_2O_3$) substrate doped with chromium (Cr), which creates ruby. Ruby is commercially available from companies such as Union Carbide in a form that can be used for substrates on solid state devices. The LED can be grown on the substrate by many known methods with the preferred method being Metal Organic Chemical Vapor Deposition (MOCVD).

Some of the light emitted from active layer 11 passes through its top surface and some passes into the ruby substrate 16, with the UV light emitted from the top surface is not visible. Some or all of the light passing into the substrate 16 is absorbed, pumping the substrate's Cr electrons to a higher energy state. As the electrons return to their equilibrium state, they emit energy as red light at a wavelength of about 630 nm. This light emits omnidirectionally, including through the top surface of the LED. Because the UV light is not visible, the new LED appears as though it is only emitting red light. Thus, the new LED provides red light without external conversion materials and without being combined with other colors or types of LEDs.

Ruby substrates also absorb yellow light at a wavelength of about 550 nm and, as the dopant electrons return to their equilibrium state, they emit red light. A nitride based LED can have an active layer made of InGaN that emits yellow light having a wavelength of about 550 nm. Some of the light passes into the ruby substrate and stimulates an emission of red light. Both yellow from the active layer and red light from the substrate is emitted from the LED's surface.

This new technique for producing different colors of LED light by doping their substrates can be used in light emitting devices made of many different material systems. The devices can have one or more active layers that can be double heterostructure, single quantum well, or multiple quantum well. The substrate can be made of many different materials other than sapphire, including but not limited to spinel, silicon carbide, gallium nitride, quartz YAGI, garnet, or oxide single crystal. It can also be made of other oxide materials such as lithium gallate, lithium niobate, or zinc oxide.

The substrate dopant can be many different rare earth or transition elements other than Cr, including but not limited to cobalt, titanium, iron, magnesium, nickel, erbium, neodymium, praseodymium, europium, thulium, ytterbium, or cerium. The different dopant and substrates work similar to the ruby substrate, absorbing certain wavelengths of light and emitting different wavelengths of light when the pumped dopant ion electrons return to their equilibrium state. For example, if a sapphire substrate is doped with nickel or magnesium it absorbs UV light and emits green light. If a sapphire substrate is doped with iron or titanium, it absorbs UV and emits blue light. If doped with cobalt, it absorbs UV light and emits green light. The substrate can also use polymers that function much the same as the rare earth and transition element dopants. The substrate 16 can be doped with the desired rare earth or transition elements by many doping methods. The preferred methods include solid state diffusion, ion implantation, beam evaporation, sputtering, or laser doping.

The substrate can be made of many different materials beyond sapphire to provide for growth of the epitaxial layers, including but not limited to silicon (Si) and silicon carbide. A suitable silicon carbide is a 4H polytype of silicon carbide, although other silicon carbide polytypes can also be used including 3C, 6H and 15R polytypes. Silicon carbide has a closer crystal lattice match to Group III nitrides than other substrate materials such as sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). SiC substrates are available from Cree Inc., of Durham, N.C. and methods for producing them are set forth in the scientific literature as well as in a U.S. Pat. Nos. Re. 34,861; 4,946,547; and 5,200,022.

Figure 2:
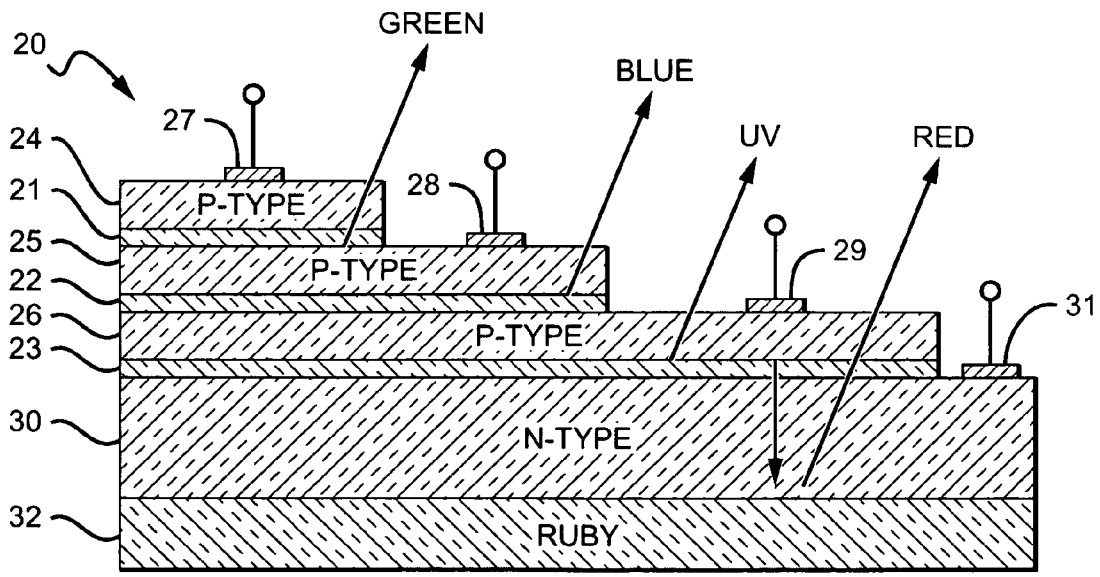
FIG. 2 is a sectional view of another embodiment of an LED according to the present invention grown on a ruby substrate and having multiple active layers.

FIG. 2 shows another embodiment of the new LED 20 which is nitride based and has three active layers 21, 22 and 23, each of which emits a different wavelength of light. This allows the LED 20 to emit multiple colors that combine to produce white light. The active layers 21, 22 and 23 are composed of InGaN in different percentages such that they respectively emit green, blue and UV light with respective wavelengths of about 520 nm, 470 nm and 400 to 420 nm. Examples of the different percentages of In necessary in the active layer to produce various colors of light include: 0 percent (%) for UV Light, 5 to 10% for near UV light, 10 to 27% for blue light, 28 to 35% for green light, and 35 to 60% for yellow light.

The LED 20 has three p-type layers 24, 25 and 26, all made of GaN. P-type layer 24 is adjacent to active layer 21 and injects holes into the active layer 21 when a bias is applied to its contact 27. Similarly, p-type layer 25 injects holes into active layer 22 when a bias is applied to its contact 28, and p-type layer 26 injects holes into active layer 23 when a bias is applied to its contact 29. The n-type layer 30 is also made of GaN and is used to inject electrons into all active layers when a bias is applied to its contact 31, with the electrons migrating into each active layer 21, 22 and 23. The entire device is grown on a ruby substrate 32.

With a bias applied across the n-type contact 31 and all p-type contacts 27, 28, and 29 (usually in the range of 3 to 4 volts), each of the active layers 21, 22 and 23 emit light omnidirectionally. Green, blue and UV light is emitted through the surface of the LED 20 and also passes into the ruby substrate 32. The Cr in the substrate 32 only absorb the UV light and as the Cr electrons return to their equilibrium state, they emit red light. Some of the red light emits from the LED's surface along with the green, blue, and UV light, all of which combine to produce white light.

Another advantage of the new LED 20 is that a bias can be applied to one or more of the p-type contacts 27, 28, and 29, which allows the LED 20 to selectively emit different colors of light. For example, with a bias applied to p-type contact 27 and n-type contact 31, holes and electrons are primarily injected into active layer 21 and it emits green light. The light is not absorbed by the ruby substrate and as a result, the LED 20 only emits green light. Similarly, with a bias applied to p-type contact 28 and n-type contact 31, the LED 20 emits only blue light. With a bias applied to p-type contact 29 and n-type contact 31, active layer 23 emits UV light that the ruby substrate absorbs and re-emits as red light. Thus, by applying a bias to one of the three p-type contacts 27, 28, and 29, the LED 20 can selectively emit green, blue, or red light.

With a bias applied to across the n-type contact 31 and two of the three p-type contacts 27, 28 and 29, two colors of light emit from the LED 20 that combine to produce additional colors. With a bias applied to contacts 27 and 28, green and blue light emit and combine to produce aqua. With a bias applied to contacts 27 and 29, green and red light emit and combine to produce yellow. With a bias applied to contacts 28 and 29, blue and red light emit to produce purple.

The brightness of light emitted from the various active layers depends upon the level of current that is applied to the respective contacts; the greater the current, the brighter the light and vice versa. Increasing or decreasing the level of the current to the active layers 21, 22, and 23, can produce variations in the colors of light emitted from the LED 20. For example, with a standard current applied to the blue active layer 22, and an increased current applied to the green active layer 21, the aqua emitted by the LED 20 would have more green compared to the aqua emitted if both active layers 21 and 22 received a normal current. This allows even greater flexibility in the colors of light emitted from the LED 20.

Figure 3:
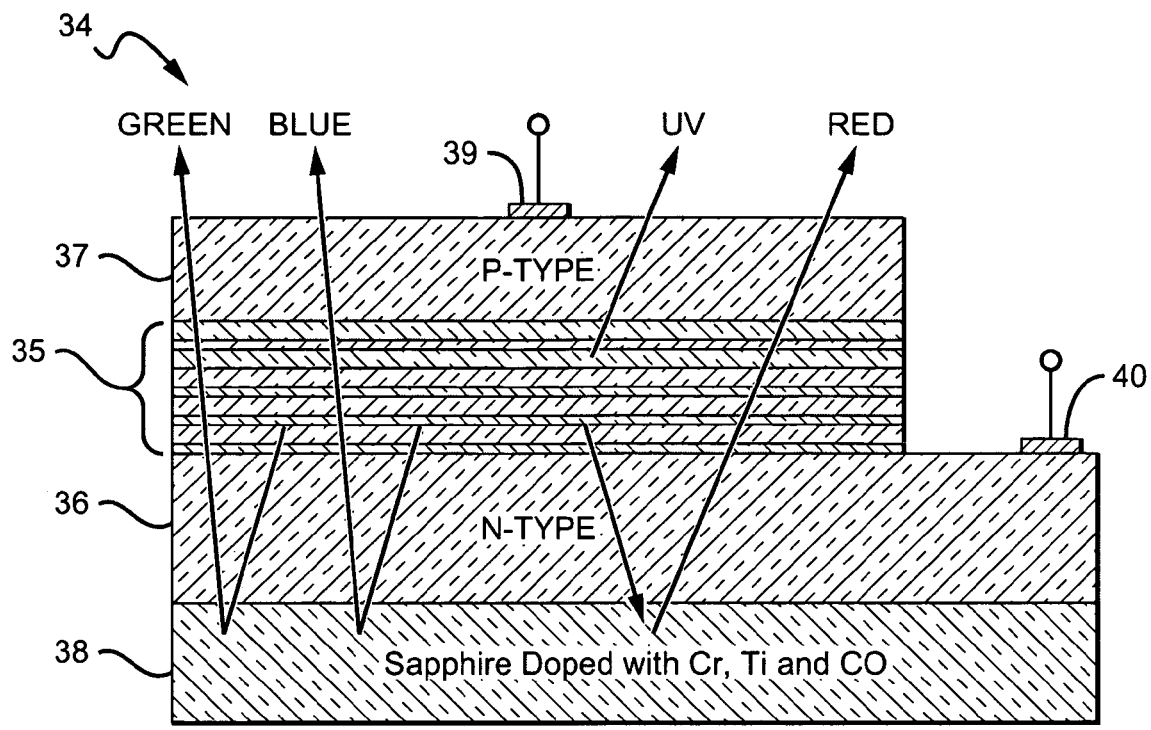
FIG. 3 is a sectional view of another embodiment of an LED according to the present invention grown on a sapphire substrate doped with multiple elements, and having a UV emitting multiple quantum well active layer.

White light can also be produced by a new LED generating only one color of light from its active layer, by doping the substrate with more than one rare earth or transition element. FIG. 3 shows another embodiment of the new LED 34 being nitride based and having a UV emitting multiple quantum well active layer 35 made of InGaN, although other types of active layers can also be used. It is sandwiched between a GaN n-type layer 36 and a GaN p-type layer 37. When a bias is applied across the p-type contact 39 and n-type contact 40, the active layer 35 emits UV light with some of it emitting from the LED surface and some of it passing into the substrate 38. The substrate 38 is doped with Cr which absorbs UV light and emits red light, Titanium (Ti) which absorbs UV light and emits blue light, and Cobalt (Co) which absorbs UV light and emits green light. The red, green, and blue light is emitted from the substrate omnidirectionally, with some of it emitting from the LED's surface to produce white light.

Figure 4:
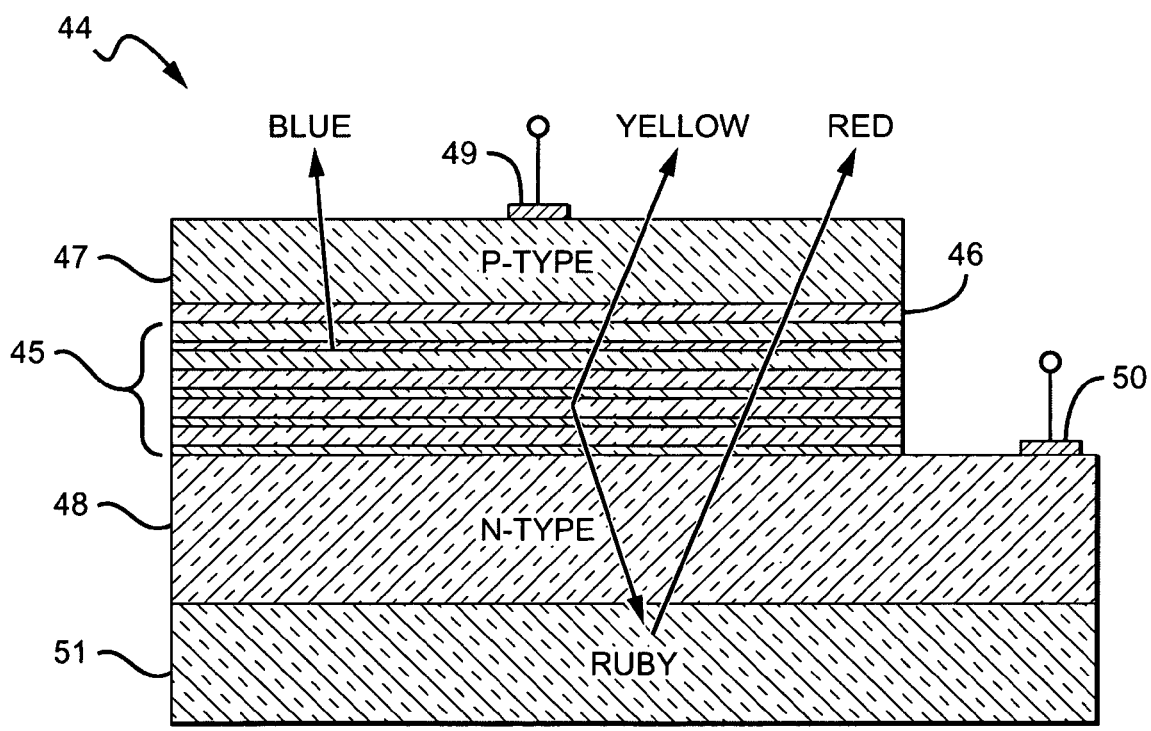
FIG. 4 is a sectional view of another embodiment of an LED according to the present invention grown on a ruby substrate, and having a blue and yellow emitting multiple quantum well active layer.

FIG. 4 shows another embodiment of the new LED 44 with an InGaN multiple quantum well active layer 45, although other types of active layers can also be used. The active layer 45 emits blue light with a wavelength of about 470 nm and yellow light with a wavelength of about 550 nm. The LED 44 has a AlGaN layer 46 on top of the active layer 45 with a p-type GaN layer 47 on top of the AlGaN layer 46. It also has an n-type GaN layer 48 below the active layer 45. A bias is applied across the active layer 45 through a p-type contact 49 and an n-type contact 50. All of the LED layers are grown on a ruby substrate 51.

When a bias is applied to the contacts 49 and 50, holes and electrons are injected into the active layer 45 which causes it to emit blue and yellow light. Some of the light emits from the surface of the LED 44 and some of it passes into the ruby substrate 51, which absorbs the yellow light and emits red light. The blue light passes through the substrate 51 and is not absorbed. Blue, yellow and red light emit from the surface of the LED 44 and combine to create a warm white light.

In other embodiments of the LED 44 according to the present invention, the active layer 45 has several quantum wells of different thicknesses, each of which can generate a different color at the same time as the other quantum wells.

This arrangement can allow the LED 44 to emit colors of light that can combine to make white light or components of white light. The LED can be provided with only one p-n junction and the active layer can be between the p- and n-regions or slightly to one side or the other. The quantum wells could be grown at the same temperature and with the same percentage of In making the structure efficiently fabricated, and possibly of higher quality. In other embodiments, however, multiple compositions of AlInGaN could also be used to change the emission wavelength.

Figure 5:
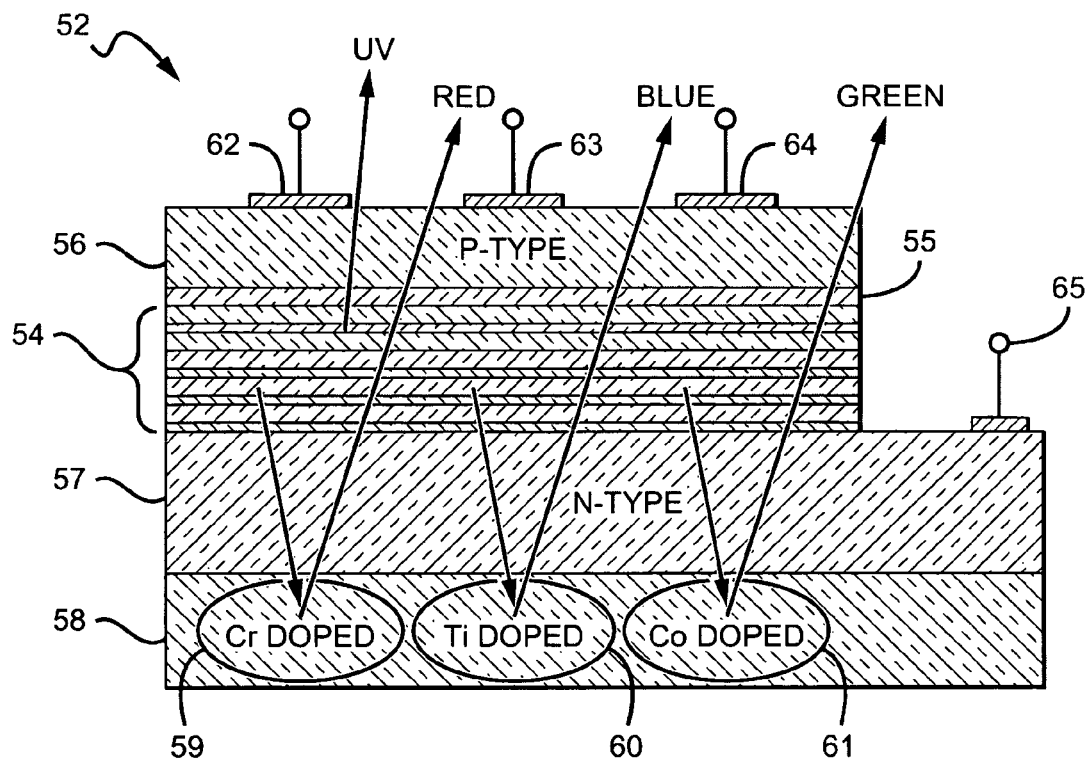
FIG. 5 is a sectional view of another embodiment of an LED according to the present invention grown on a sapphire substrate having doped color centers, and having a multiple quantum well active layer.

The new LED can also generate different colors of light by doping the substrate with "color centers" of various rare earth and transitional elements. The color centers consist of bodies of different doping materials within the substrate. FIG. 5 shows the new LED 52 grown on a substrate 58 which contains three color centers 59, 60 and 61. The LED comprises a multiple quantum well active layer 54 of InGaN which emits UV light. A p-type AlGaN layer 55 is grown on the active layer, a p-type GaN layer 56 is grown on the AlGaN layer 55, and an n-type GaN layer 57 is grown below the active layer 54. The entire LED 52 is grown on a sapphire substrate that has a Cr doped color center 59, a Ti doped color center 60, and a Co doped color center 61.

The LED 52 also includes an n-type contact 65 and three p-type contacts 62, 63, and 64, on the p-type layer 56, each p-type contact above a respective color center. By manipulating the bias applied to the various contacts, the color emitted by the LED 52 can be changed. With a bias applied to the n-type contact 65 and p-type contact 62, the active layer 54 generates light primarily below the contact 62 and the light from the active layer passes into the substrate 58 such that most of it passes into the Cr doped color center 59. Some or all of the light is absorbed by the color center 59 and re-emitted as red light. With a bias instead applied to the p-type contact 63, the majority of light from the active layer enters the substrate at the Ti doped color center 60 which absorbs some or all of the light and re-emits blue light. Finally, with a bias applied at the p-type contact 64, the majority of light enters the substrate at the Co color center which absorbs some of the light and re-emits green light. Accordingly, by applying a bias across the n-type contact and one p-type contact, the LED 52 can selectively emit red, blue and green light.

Like the LED 20 in FIG. 2, a bias across the n-type contact 65 and more than one p-type contact 62, 63, and 64, creates different colors such as aqua, yellow, purple, and white. They are created by combining the colors from the different emitting color centers. The level of the current applied to the contacts can also be increased or decreased to provide variations of the colors emitting from the LED 52. The greater the current applied to a p-type contact 59, 60 and 61, the greater the intensity of light emitted from the active layer 54 below the contact, and the greater the intensity of light absorbed and emitted from the color center below the contact. When the intensity of a particular color is increased, it is more dominant when combined with light from the other color centers.

Figure 6:
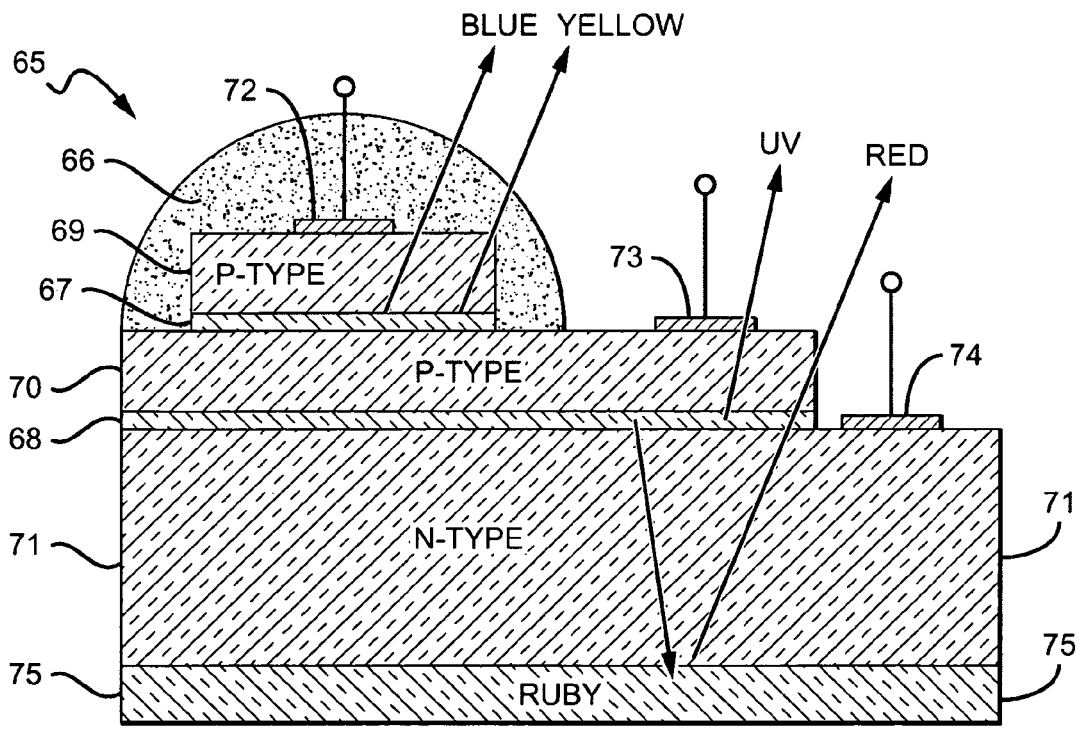
FIG. 6 is a sectional view of another embodiment of an LED according to the present invention grown on a ruby substrate and having two active layers, one of which is partially surrounded by a downconverting material.

FIG. 6 shows another embodiment of the new LED 65 that is partially surrounded by a YAG:Ce downconverting material 66. The LED 65 has an active layer 67 emitting blue light with a wavelength of about 470 nm and an active layer 68 below it, emitting UV light having a wavelength of about 420 nm. It also has two p-type layers 69 and 70 and an n-type layer 71 all of which have a respective contact 72, 73, and 74. The downconverting material 66 partially surrounds the top active layer 67 and it absorbs some of the blue light and downconverts it to yellow light. The LED is grown on a ruby substrate 75 that absorbs the UV light from the lower active layer 68 and re-emits red light. As a result, the LED 65 emits blue, yellow and red light that combines to create white light.

Many other embodiments of the new LED can be constructed in accordance with the invention. The new LED can be grown on a ruby substrate and have three active layers, one emitting light with a wavelength of about 400-420 nm, another emitting light with a wavelength of about 500 nm and the last emitting light with a wavelength of about 550 nm. Another embodiment can be grown on a ruby substrate and have three active layers, one emitting light with a wavelength of about 400-420 nm, another emitting light with a wavelength of about 470 nm and the last emitting light with a wavelength of about 520 nm. The LED can also be grown on a ruby substrate and have two active layers, one emitting about 400-420 nm light and the other emitting about 500 nm light, or it can be grown on a ruby substrate and have two active regions one emitting about 500 nm light and the other emitting about 550 nm light.

Figure 7:
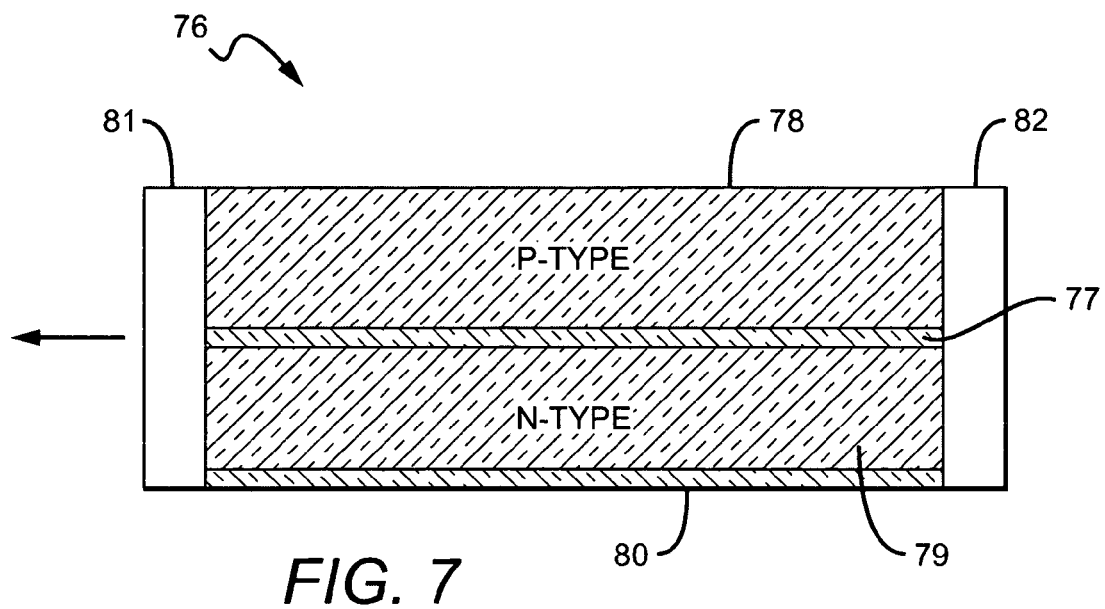
FIG. 7 is a sectional view of one embodiment of a solid state laser according to the present invention grown on a doped substrate.

The present invention can also be used with solid state laser such as edge emitting lasers and vertical cavity lasers. FIG. 7 shows a nitride based edge emitting laser 76 which is structurally similar to a LED. It has an InGaN active layer 77 sandwiched between a p-type GaN layer 78 and an n-type GaN layer 79, all of which are grown on a substrate 80 that is doped with Co. The laser 76 also has mirrors 81 and 82 to reflect light between the mirrors, partially escaping through mirror 81, resulting in a highly collimated/coherent light source.

When a bias is applied to the p and n-type layers 78 and 79 through electrical contacts (not shown), the active layer 77 emits light omnidirectionally and some of the light passes into the substrate 80. Some or all of the light is absorbed and re-emits as green. The light reflects between the mirrors 81 and 82 to produce stimulated LED emission of UV light and/or green light. The UV light will not be visible to the eye and as a result, the laser 76 appears as though it is emitting green light. Depending an the dopant used in the substrate 80, the color of the emitted light can be different, as described above. For example, the substrate can be doped with Cr such that it absorbs the UV light and emit red light. The new red laser is more temperature tolerant compared to conventional red solid state lasers.

Figure 8:
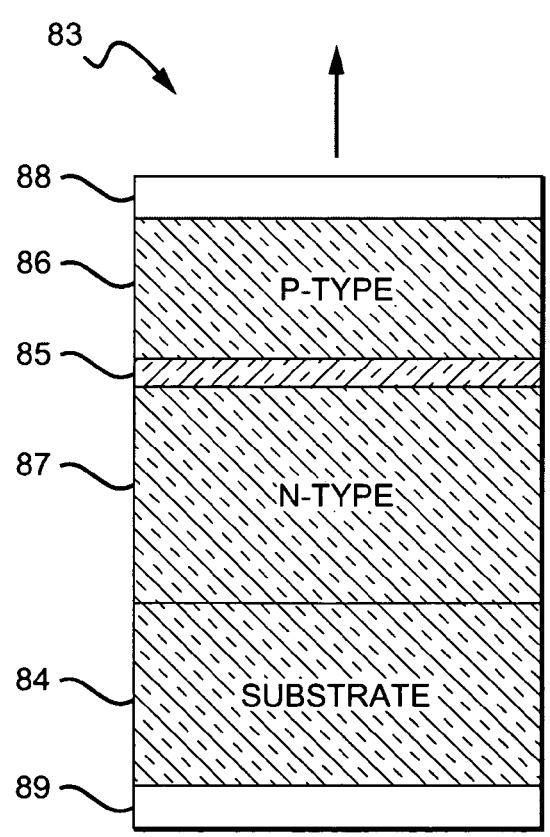
FIG. 8 is a sectional view of one embodiment of a nitride based top emitting solid state laser according to the present invention grown on a doped substrate.

FIG. 8 shows a vertical cavity laser 83 which works much the same as an edge emitting laser and also has a doped substrate 84 and an UV emitting active layer 85 sandwiched between two oppositely doped layers 87 and 86. It has a mirror on its top surface 88 and its bottom surface 89 and the collimated light is generally emitted through the top mirror 88. In operation, the light from the active layer 85 emits omnidirectionally and some of it reflects between the mirrors 88 and 89 to reach stimulated emission. Some of the light from the active layer 85 also enters the substrate 84 where it is absorbed and emits a different color depending on the dopant in the substrate. The light from the substrate 84 also reflects between the mirrors 88 and 89 and emits from the top surface as a collimated light. The UV light is not visible and the laser appears as though it is only emitting the wavelength of light from its substrate 84.

Other embodiments of the present invention can include rare earth or transition elements in epitaxial layers of the LEDs and solid state lasers, and in particular, in those layers that do not need to be conductive and provide a suitable host material. Typical white emitting LEDs comprise external phosphors for wavelength conversion, but in the present invention the conversion material is included in the epitaxial layers. Like the embodiments above having a doped substrate, the rare earth and transition elements in the epitaxial layer absorb certain wavelengths of light that pump the electrons of the dopant material to a higher energy state. As the electrons are drawn back to their equilibrium, light is emitted having a different wavelength than the absorbed wavelength.

Figure 9:
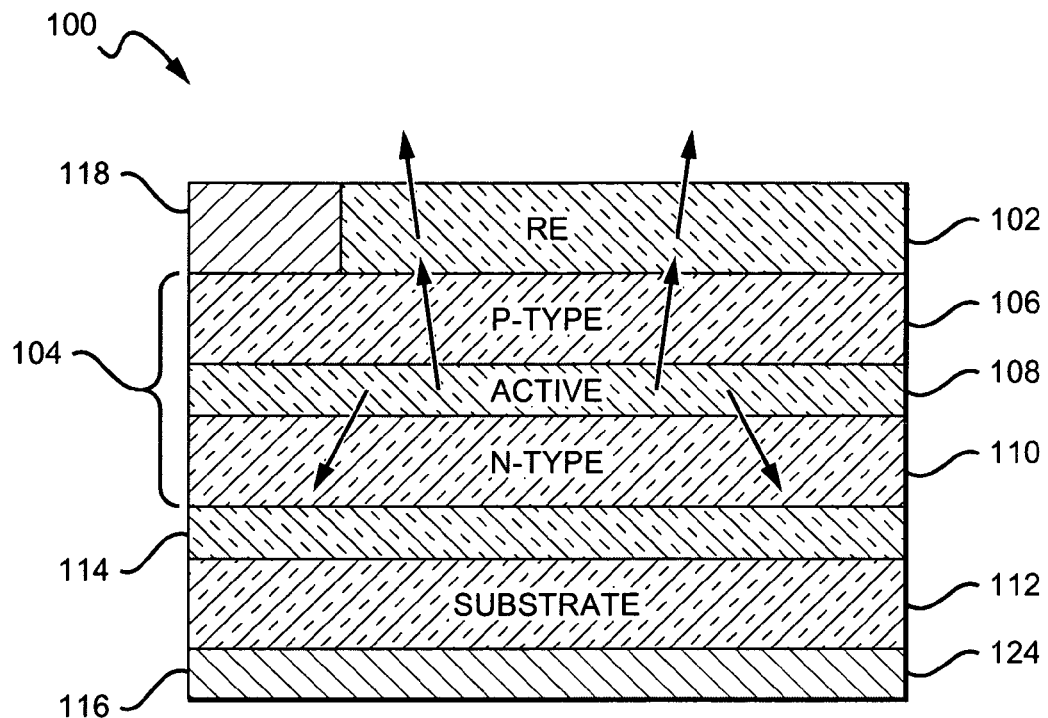
FIG. 9 is a sectional view of one embodiment of an LED according to the present invention having a rare earth (RE) doped epitaxial layer.

FIG. 9 shows one embodiment of an LED 100 according to the present invention with a rare earth or transition element doped epitaxial layer absorption layer 102. Absorption layer refers to a layer of semiconductor material that is doped with one or more rare earth or transition element that absorbs light and re-emits at least one different wavelength of light. This doped layer is hereinafter referred to as an "RE layer".

The LED 100 can be made of many different material systems, with the preferred being the Group-III nitride material system. Group III nitrides refer to those semiconductor compounds formed between nitrogen and the elements in the Group III of the periodic table, usually aluminum (Al), gallium (Ga), and indium (In). The term also refers to ternary and quanternary compounds such as AlGaN and AlInGaN. The LED structure 104 comprises an active region 108, sandwiched between a p-type layer 106 and n-type layer 110. In a preferred embodiment, the active region 108 is in adjacent contact with the p- and n-type layers 106, 110, and the material forming p- and n-type layers can be GaN and the material forming the active layer can be InGaN. In alternative embodiments the p- and n-type layer materials can be AlGaN, AlGaAs or AlGaInP. In a preferred LED 100, the p-type layer 106 can be Mg doped GaN, the n-type layer can be Si doped GaN, AlGaN or InAlGaN, and the active layer can be a single quantum well or multiple quantum well AlGaN or InAlGaN.

The LED structure 104 is formed on a substrate 112 and the LED 100 as shown comprises a substrate as part of the overall package. It is understood however, that for the LED 100 (and the other LED/laser embodiments described herein), the substrate 112 can be removed after formation of the LED structure 104, or the LED structure can be formed using other methods that do not utilize a substrate. Accordingly, the LED 100 can have an LED structure 104 operating without a substrate 112. The substrate 112 can be made of the different materials listed above, but is preferably made of silicon carbide.

The LED 100 can also comprise a nucleation layer 114 between the substrate 112 and LED structure 104 that is included to compensate for lattice mismatches between the substrate and LED structure. The nucleation layer is also known as a buffer layer and can comprise multiple layers of different compositions. The formation of a nucleation layer 114 can depend on the material used for the substrate 112. For example, methods of forming a nucleation layer 114 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, 5,739,554, 6,841,001, each of which is incorporated herein by reference as if fully set forth herein.

The LED further comprises a n-ohmic metal (or contact) 116 and a p-ohmic metal (or contact) 118, each of which can be made of many different conductive materials including but not limited to alloys of titanium, aluminum, gold, nickel platinum, chromium, alloys of titanium and tungsten, or platinum silicide. The p-ohmic and n-ohmic metals are arranged such that when a bias is applied across them, current is injected into the p-type and n-type layers 106, 110 to cause the LED's active region 108 to emit light. The p-ohmic metal 118 can be arranged in many different ways, and as shown is on a portion of the p-type layer 106. Current from the p-ohmic metal spreads into the p-type layer 106, and in some embodiments additional current spreading can be included, such as including a current spreading layer between the p-ohmic metal 116 and p-type layer 106, or by having the p-ohmic metal cover more of the p-type layer such as by having branches or fingers that extend across the p-type layer 106. The n-ohmic metal covers the bottom surface of the substrate 112, and the substrate 112 is made of a material that allows for current to spread from the n-ohmic metal 116 though the substrate 112 (and nucleation layer 114) to the n-type layer 110. The n-ohmic metal 116 can cover less than all of the surface of the substrate 112 and can have different designs, such as a star design.

The RE layer 102 preferably comprises an epitaxial layer doped with one or more rare earth or transition elements (RE elements). The RE layer 102 can be in a different location in LEDs according to the present invention, but as shown is on the p-type layer 106. The RE layer 102 can comprise many different materials and can have different characteristics, with the RE layer arranged so that its RE elements absorb light from the active region 108 and re-emit wavelength of light different from the active region light.

In a typical LED according to the present invention, the rare earth elements in RE layer 102 emit photons at longer wavelengths than the excitation photons for the active region 108. The emission wavelength(s) of the active region are chosen in combination with the emission wavelengths and relative concentrations and combinations of the RE elements to achieve the desired color combination for the desired application. This can eliminate the need for separate phosphors to make LEDs that can emit colors that are typically difficult to achieve, such as white emitting LEDs.

The RE layer is preferably made of InAlGaN doped with one or more RE elements or comprises a multiple quantum well (MQW) layer doped with one or more RE elements. The RE elements can be any of those described above and the active region 108 can emit different wavelengths of light as further described in the embodiments of LED above, with the light emission cooperating with the particular rare earth elements.

For the MQW RE layer, the number of quantum wells in the RE layer 102 can be tailored with the desired number of periods to control the wavelength cross-section for absorption and re-emission of the RE layer. The larger the number of periods that can be formed in the RE layer, the larger the wavelength cross-section that can be absorbed. The MQW RE layer 102 should have the right number of periods for the absorption of the particular wavelength of light emitted by the active region 108. In addition, the right composition and thickness of the quantum wells can be chosen for the desired wavelength absorption. The RE layer can also be n- or p-doped to vary the Fermi level and conductivity, and the bandgap of the RE layer can also comprise a tuned composition to increase efficiency. In one embodiment the RE layer is doped with Co and n-type or p-type dopants to control the Fermi level to enhance emission. For example, if the bandgap of the RE layer is slightly smaller than the emission of the LED's active region 108, the resulting re-emission is more efficient. Stated differently, the active region 108 preferably emits photon energy slightly larger than the emission energy of the rare earth host material in the RE layer 102. Various embodiments of the LED 100 emit either blue or UV light from the active region, with the RE elements and/or the RE layer 102 absorbing the blue or UV light and emitting a different wavelength of light.

The RE layer 102 can be deposited in-situ or ex-situ, and in one embodiment that RE layer 102 is deposited in-situ in a metal organic chemical vapor deposition (MOCVD) reactor following deposition of the LED structure 104 on the substrate 112. The RE elements are preferably introduced from typical MOCVD source gases. The RE layer is preferably doped during the same process as the growth of the LED, or epi growth. In other embodiments it can also be doped through implantation and annealing. Multiple RE elements can be used to achieve the optimal color mixture. Many different RE elements can be used, including but not limited to Er (545 nm), Eu (615 nm), Pr (605, 635 nm), Tm (450 nm), Dy, Ce (475, 530 nm), Tb (545 nm), Mn, Cu, etc.

As further described below, if the RE layer is grown last, contamination of the active regions with RE elements is avoided. Before subsequent growth runs, the reactor can be cleaned to avoid contamination. A separate deposition system can be used to deposit the RE layer. Further, structural defects from the heavy doping of the RE layer would not propagate into the active layer if the heavily doped layer is grown last.

Figure 10:
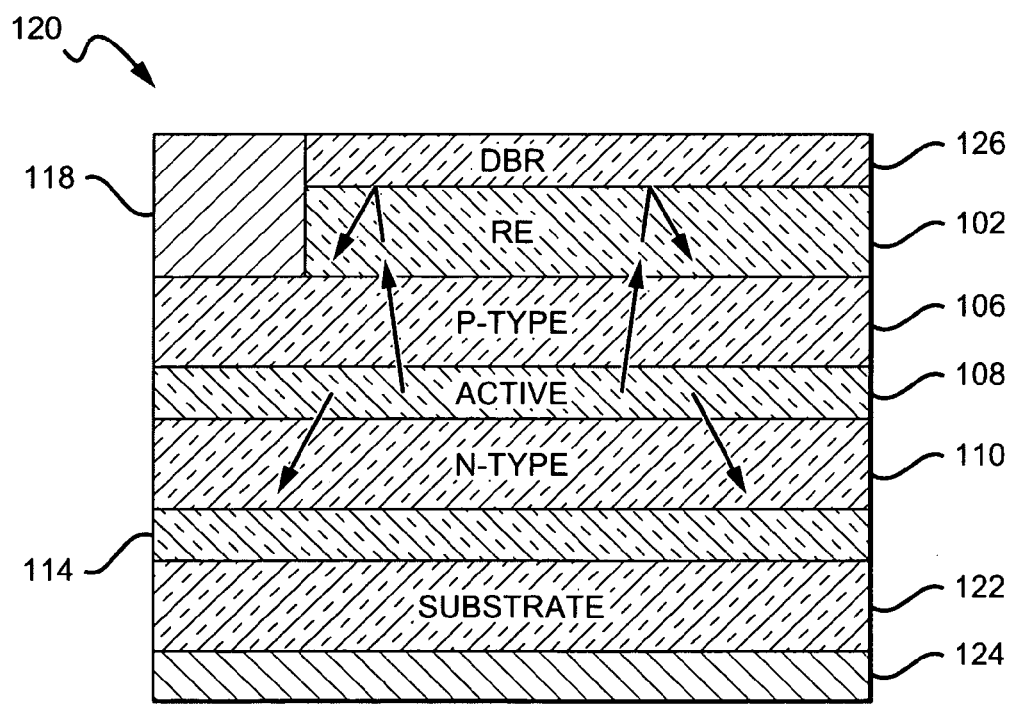
FIG. 10 is a sectional view of another embodiment of an LED according to the present invention having an RE doped epitaxial layer and distribute Bragg reflector (DBR)

FIG. 10 shows another embodiment of an LED 120 according to the present invention that can have many of the same features as the LED 100 in FIG. 9. For LED 120 and the embodiments described below, it is understood that the features having the same reference numerals to those in LED 100 are the same or similar and the description of these features above generally applies to this embodiment.

The LED 120 comprises a p-type layer 106, active region 108, n-type layer 110, nucleation layer 114, and p-ohmic metal 118. The LED 120 further comprises a RE layer 102 arranged to absorb light emitted from the active region and re-emit light at a different wavelength. The LED 120 further comprises a substrate 122, an n-type ohmic contact 124, and a Distributed Bragg reflector (DBR) on the RE layer 102. DBRs are known and typically comprise 5-50 pairs of two materials with different refractive indices. As a result of the differences in refractive index, Fresnel reflection occurs at each of the interfaces. Usually the refractive index between the two materials is small so that the magnitude of the Fresnel reflection at one interface is also small. DBRs, however, consist of many interfaces. More importantly, the thickness of the two materials is chosen in such a way that reflected waves are in constructive interference. Accordingly, the DBR in the LED 120 can reflect light back toward the substrate 122 and n-ohmic contact, such that the substrate 122 is the primary emitting surface of the LED 120. The substrate 122 is preferably formed of an at least partially transparent material and the n-ohmic metal 124 can comprise thin metals or thin metal combinations of 1 nm to 50 nm in total thickness to allow most light to pass through or the n-type ohmic metal 124 can comprise a transparent conductor such as ITO. In other embodiments the n-type ohmic metal 124 can have a shape, such as a star shape, so that at least some of the light passing from the substrate 122 is not blocked by the n-type ohmic metal 124.

Light from the active region 108 passes through the RE layer 102 where at least some of the light is converted to a different wavelength by the RE elements. The DBR 126 reflects the light emitting toward it from the RE layer, and any active region light back toward the substrate 122. The active region light that reflects off the DBR 126 can pass through the RE layer a second time where at least some of it can be converted by the RE elements. The LED emits a combination of light from the active region 108 and from the RE layer 102. In other embodiments of the LED 120 according to the present invention, the DBR can be tuned to more efficiently reflect the light from the active region 108 and allow the converted wavelength to pass.

Figure 11:
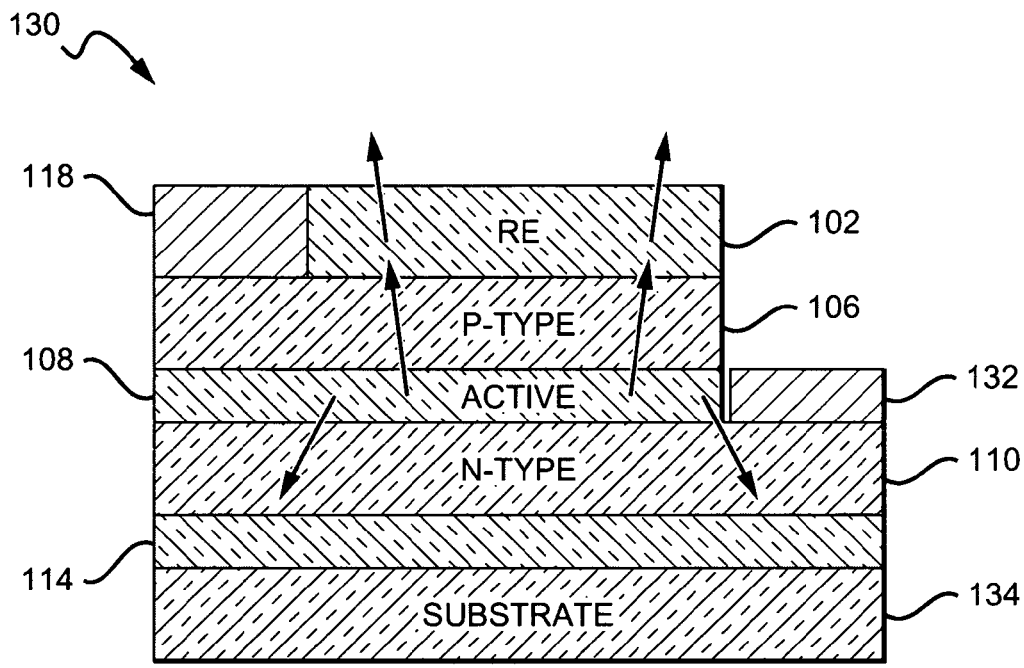
FIG. 11 is a sectional view of one embodiment of a horizontal geometry LED according to the present invention having an RE doped epitaxial layer.

FIG. 11 shows another embodiment of an LED 130 according to the present invention having a horizontal geometry, and also comprises a p-type layer 106, active region 108, n-type layer 110, nucleation layer 114, p-ohmic metal 118, and an RE layer 102. A portion of the RE layer 102, p-type layer 106 and active region 108 is etched down to the n-type layer 110 to reveal a surface for an n-ohmic metal 132. A bias is applied across the p-ohmic metal and n-ohmic metal to cause the active region 108 to emit light. At least some of the light from the active region 108 passing through the RE layer 102 is converted to a different wavelength of light by the RE elements, with the RE layer being the primary emitting surface. The LED 130 also comprises a substrate 134 that can comprise a transparent or opaque material.

Figure 12:
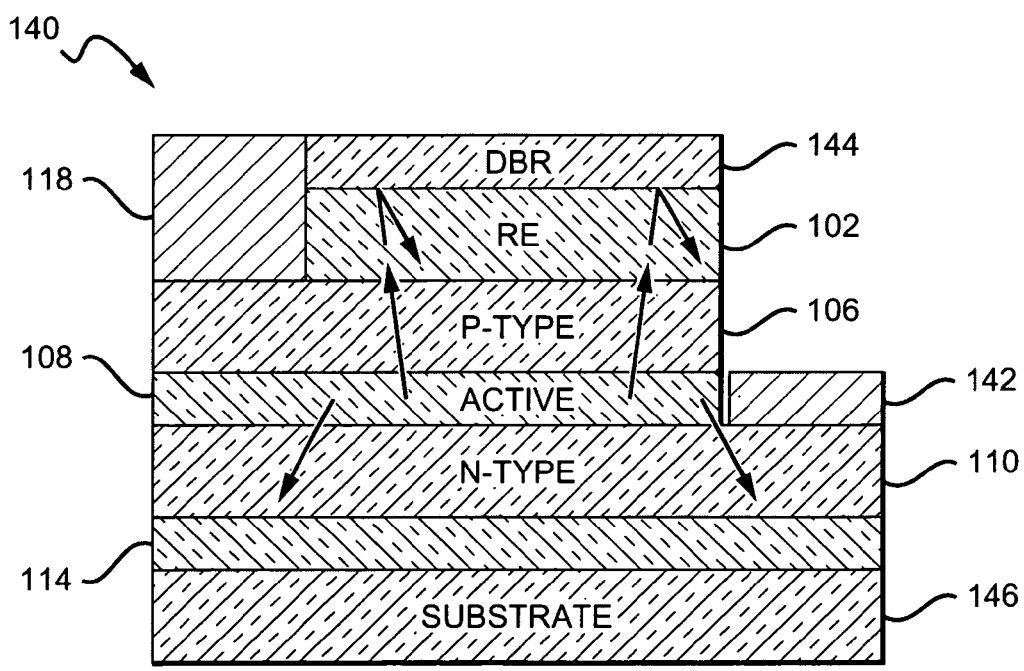
FIG. 12 is a sectional view of another embodiment of a horizontal geometry LED according to the present invention having an RE epitaxial layer and DBR.

FIG. 12 shows another embodiment of an LED 140 according to the present invention, also having a horizontal geometry and comprising a p-type layer 106, active region 108, n-type layer 110, nucleation layer 114, p-ohmic metal 118, and an RE layer 102. A portion of the RE layer 102, p-type layer 106 and active region 108 is etched down to the n-type layer 110 to reveal a surface for an n-ohmic metal 142. The LED 140 further comprises a DBR 144 arranged to reflect light from the active region similar to the DBR 126 shown in FIG. 10 and described above. The DBR 144 is arranged to reflect light from the active region 108 and RE Layer 102 back toward the substrate 146 such that the substrate 146 becomes the LEDs primary emitting surface. The DBR can also be tuned to more efficiently reflect the stimulated light from the active region 108 and allow the converted wavelength to pass. In other embodiments according to the present invention, one or more DBRs can be included in the 140 (and in the other LED/laser embodiments described herein) to provide additional reflection or conversion. For example, a DBR could be included below layer 110 for additional conversion. In other embodiments, a reflective metal layer could be used in addition to or instead of a DBR.

The RE layer can be arranged in other locations in an LED according to the present invention. One factor to be considered in these arrangements is that the RE layer can become insulating with the addition of RE elements. Depending on the location of the RE layer, the insulating characteristics can interfere with current injection into the active region and if the RE layer is included in the active region is can interfere with recombination in the active region. Another factor to be considered is that RE reactants may remain in the reaction chamber after deposition of RE layer. These reactants can contaminate subsequent layers, giving them insulating characteristics.

In some embodiments the insulating characteristics of the RE layer can be countered with heavy enough n-type or p-type doping and proper choice of rare earth doping and concentration. With the correct doping and concentration, thin RE layers can be provided that are sufficiently conductive. This can allow for their use in vertical geometry devices without adding significant resistance. In other embodiments, the RE layer can have quantum dots instead of quantum wells, with current passing between the quantum dots which can allow the RE layer to retain conductive characteristics.

Figure 13:
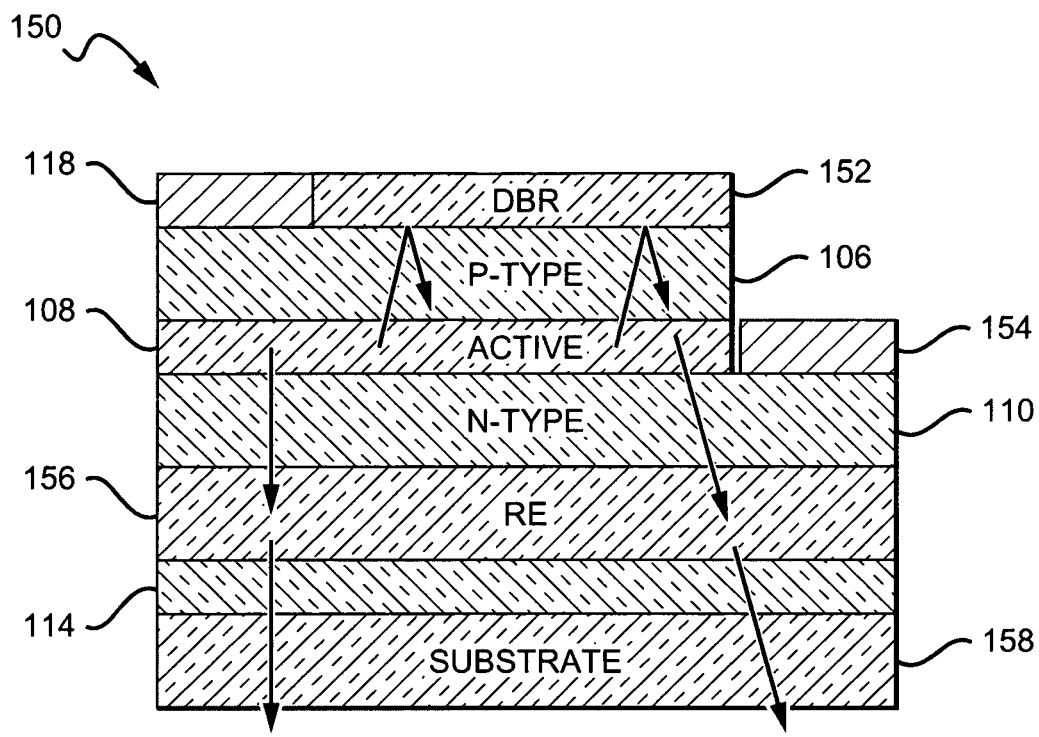
FIG. 13 is a sectional view of another embodiment of horizontal geometry LED according to the present invention having an RE epitaxial layer and DBR.

FIG. 13 shows another embodiment of a horizontal geometry LED 150 according to the present invention comprising a p-type layer 106, active region 108, n-type layer 110, nucleation layer 114, p-ohmic metal 118, and a DBR 152 on the p-type layer 106. The DBR 152, p-type layer 106 and active region 108 are etched to the n-type layer 110 for an n-type ohmic metal 154. An RE layer 156 is arranged between the n-type layer 110 and the nucleation layer 114 and the LED 150 also comprises a substrate 158. Light is emitted from the active region 108 toward the substrate and passes through the RE layer 156, and light emitted toward the DBR 152 reflects back toward the substrate, through the RE layer 156. The horizontal geometry of the LED 150 allows the RE layer 156 to have insulating properties without interfering in the light emission by the active region 108. It is understood that the RE layer can be in different locations according to the present invention, as long as the insulating characteristics or RE doped epitaxial material is properly accounted for as discussed above.

Figure 14:
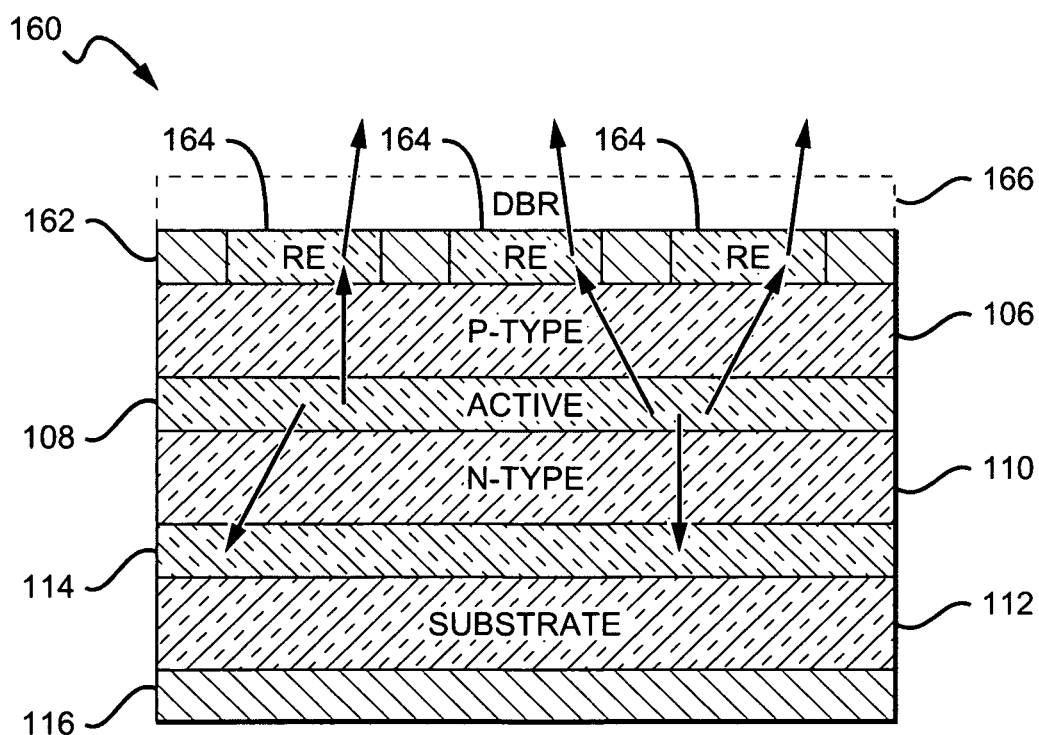
FIG. 14 is a sectional view of an LED according to the present invention having RE epitaxial layers integrated with a contact layer.

FIG. 14 shows another embodiment of an LED 160 according to the present invention having vertical geometry comprising a p-type layer 106, active region 108, n-type layer 110, substrate 112, a nucleation layer 114, and an n-ohmic metal 116. The p-ohmic metal 162 is included on the p-type layer 106 having a grid pattern which allows for efficient current spreading into the p-type layer 106. The RE layer 164 is arranged in portions in the openings of the grid pattern of the p-ohmic metal 162. As shown, a thin layer of p-ohmic metal can remain in the openings of the grid pattern and by being thin it does not substantially block light passing through from the active region 108. Alternatively, the openings in the grid pattern would have no p-ohmic metal or the p-ohmic metal can comprise a transparent material. Light from the active region passes into the RE layer 164 where it is converted to another wavelength of light and is emitted from the LED 160.

The LED 160 can be fabricated using different processes. In one process, the RE layer can be deposited in-situ and then etched in a grid pattern for the p-ohmic metal to be deposited using conventional metallization techniques. Using this method there would be no p-ohmic metal between the RE layer and the p-type layer. In another process, the p-ohmic metal can be deposited first on the p-type layer 106 and openings can be etched to deposit the RE layer 164. Using this process, the RE Layer can be deposited ex-situ and can comprise materials other than a Group-III nitride material. The RE layer can also include phosphors with the RE elements. The RE layer 164 can also be doped with different RE elements in the different grid openings, such that some or all of the openings emit different wavelengths of light. This emitted light can combine such that the LED 160 emits a wavelength combination of light from the openings. The RE layer could have RE elements that have a bandgap near the emission wavelength of the active region 108 for higher efficiency and can comprise elements to give the RE layer conductive characteristics for current spreading.

The LED 160 can also be arranged so that the substrate 112 is the primary emitting surface with the substrate made of a substantially transparent material. The p-ohmic metal 162 can be made of a material that reflects light from the active region 108. The RE layer can comprise a DBR (not shown) in each of the grid openings, or a DBR 166 can cover the RE layer 164 and p-ohmic metal 162. The DBR 166 (and DBR in grid openings) can be deposited ex-situ and can comprise many different materials and material combinations, such as TiO₂/SiO₂, MgO, ZnO or ZnCaO. With the substrate being the primary emitting surface, the n-ohmic contact 116 should be thin, transparent, or in a pattern as described so it does not substantially block light emitting from the LED 160. Alternatively, LED 160 can have a horizontal geometry as described above so that the n-ohmic metal is not on the substrate 112.

Figure 15:
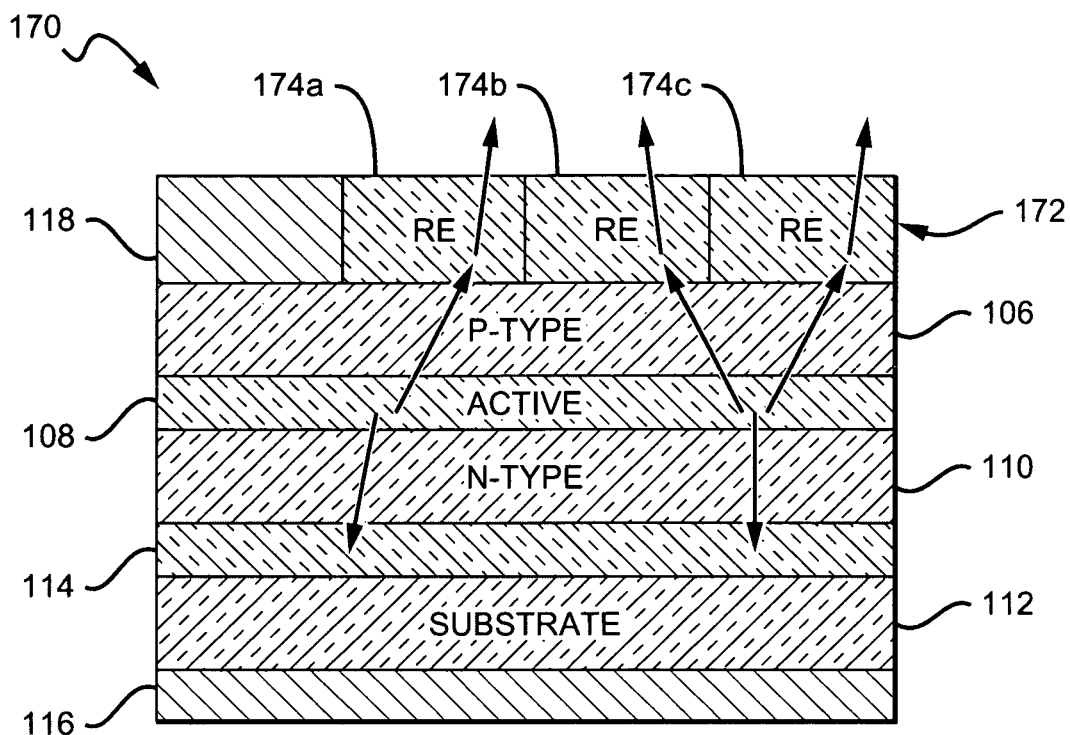
FIG. 15 is a sectional view of an LED according to the present invention having a multiple section RE epitaxial layer.

FIG. 15 shows another embodiment of an LED 170 according to the present invention comprising a p-type layer 106, active region 108, n-type layer 110, substrate 112, a nucleation layer 114, n-ohmic metal 116 and p-ohmic metal 118. The LED further comprises an RE layer 172 divided into separate RE layer sections 174a-c, each of which can have a different RE element doping, such as with different RE elements, in different combinations, or in different concentrations. Light from the active region 108 passes through the RE layer and each of the sections 174a-c is doped to absorb the active region light and emit a different wavelength of light. The LED 170 emits a wavelength combination of the light emitted from the RE layer sections 174a-c.

The LED 170 can be fabricated using many different methods, with one method being the deposition of one RE epitaxial material and etching the material to remove part of the layer to form one of the sections 174a-c. Another RE epitaxial material can be deposited in the etched area and etched to form a second of the sections 174a-c. The third RE epitaxial material can then be deposited in the etched area to form the third of the sections 174a-c.

Figure 16:
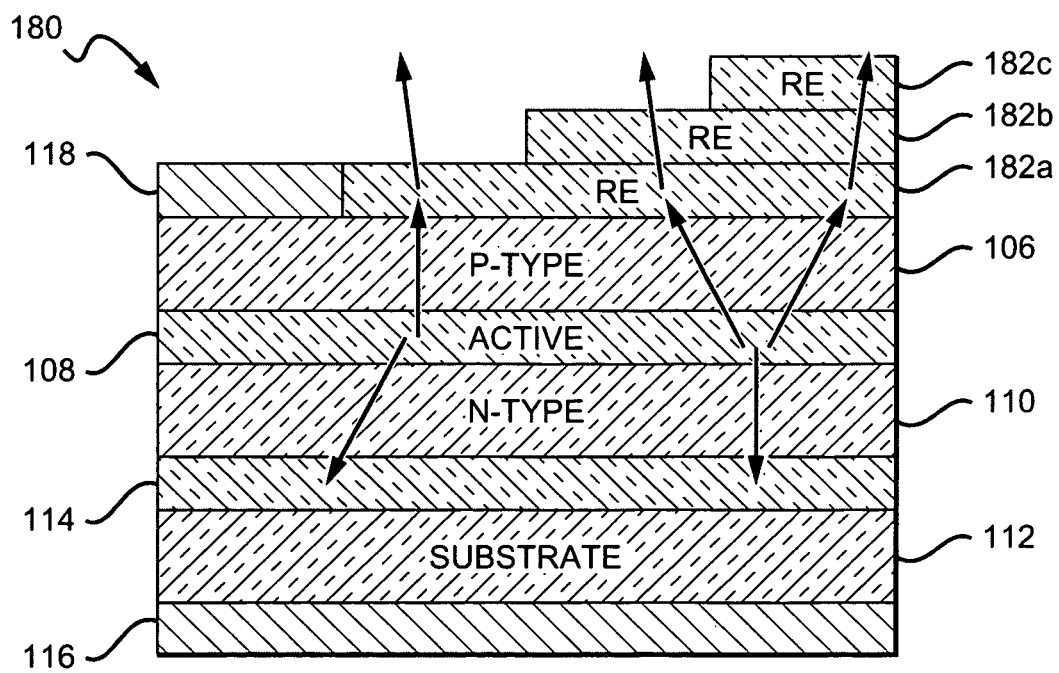
FIG. 16 is a sectional view of an LED according to the present invention having multiple RE epitaxial layers.

FIG. 16 shows another embodiment of an LED 180 according to the present invention comprising a p-type layer 106, active region 108, n-type layer 110, substrate 112, a nucleation layer 114, n-ohmic metal 116 and p-ohmic metal 118. The LED 180 further comprises multiple RE layers 182a-c stacked on the p-type layer 106. The RE layers 182a-c can have different RE element doping such as with different RE elements, in different combinations, or in different concentrations, so that each absorbs some of the light emitted by the active region and converts the light to a different wavelength of light. In this embodiment, the first of the RE layers 182a does not absorb all the active region light so that some of the light passes into the second of the RE layers 182b. Similarly, the second of the RE layers 182b does not absorb all the active region light that passes through it so that some of it passes into the third of the RE layers 182c. This allows the LED 180 to emit colors from all of the RE layers 182a-c.

In other embodiments, the second and third RE layers 182b, 182c can be doped to absorb light reemitted from the RE doping in the layer below. For example, second RE layer 182b can be doped to absorb the re-emission from the doping in the first of the RE layers 182a, and the third can be doped to absorb the re-emission from the second of the RE layers 182b. In still other embodiments, each of the RE layers can cover one of the RE layers below it, or only some cover the layer below it.

The LED 180 can be fabricated using different methods, and one suitable method comprises in-situ depositing the first and second RE layers 182a, 182b, and etching a portion of the second RE layer to reveal a portion of the first RE layer surface. The third RE layer 182c can then be deposited on the second RE layer 182b and etched as desired to reveal a portion of the second RE layer surface.

Figure 17:
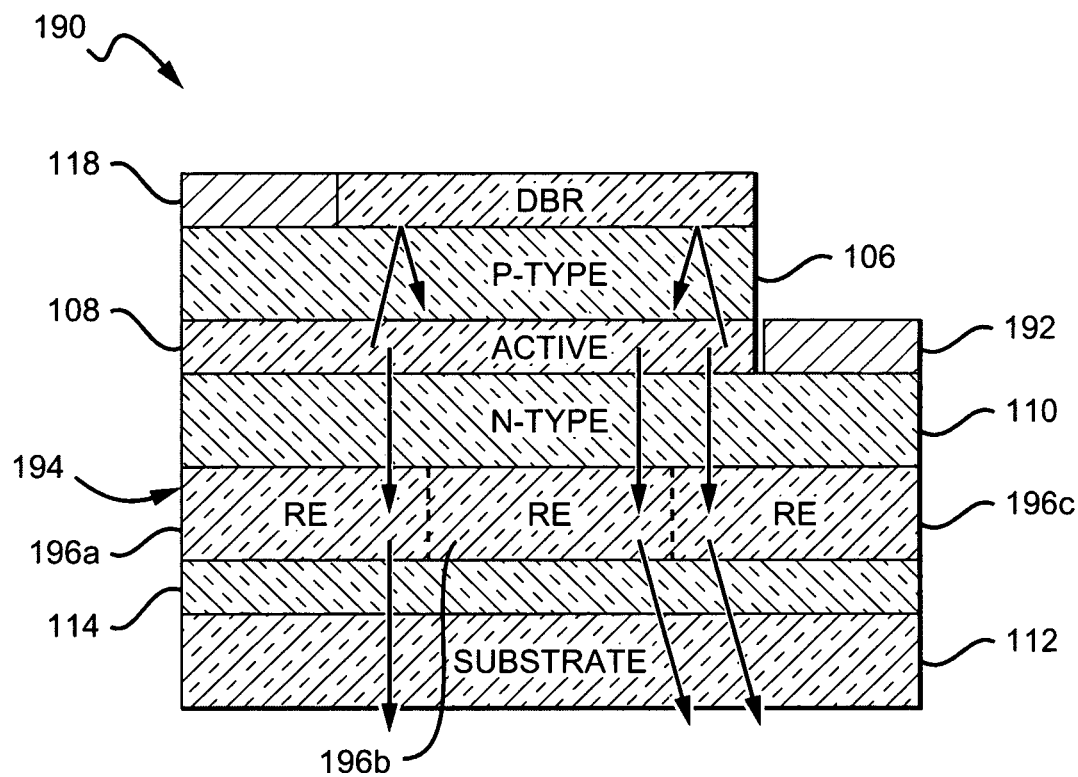
FIG. 17 is a sectional view of an LED according to the present invention also having a multiple section RE epitaxial layer.

FIG. 17 shows another embodiment of horizontal geometry LED 190 according to the present invention comprising a p-type layer 106, active region 108, n-type layer 110, substrate 112, a nucleation layer 114, and p-ohmic metal 118. The LED 190 comprises an n-type ohmic contact 192 that is deposited on the n-type layer 110. The LED 190 further comprises an RE layer 194 arranged between the nucleation layer 114 and the n-type layer 110 that is divided into RE layer sections 196a-c. Each of the sections 196a-c can have a different RE element doping and the LED 190 functions in much the same way as the LED 150 shown in FIG. 13 and described above. In LED 190, however, each of the sections absorb light emitted from the active region 108 and convert the light into different wavelengths of light. The LED 190 then emits a wavelength combination of the light emitted from the sections (and the active region).

The LED 190 can be fabricated using different methods, such as depositing the section in-situ in the same way that the RE layer sections 174a-c shown in FIG. 15 and described above are deposited using the deposition and etching process.

Other embodiments of the LED 190 according to the present invention can comprise stacked RE layers in the same location as RE layer 194.

It is understood that many different variations and combinations of the embodiments described above can be provided according to the present invention taking into account the considerations mentioned above. There can be many different levels of complexities for the LEDs according to the invention, with the additional complexities typically requiring additional processing steps. For example, the RE layer can comprise thin layers of InAlGaN doped with luminescent centers that can absorb active region light and emit different wavelengths of light. The active region of the LEDs 100, 120, 130, 140, 150, 160, 170, 180 and 190 above can also have multiple active layers arranged similar to the active layers 21, 22 and 23 of the LED shown in FIG. 2 and described above. These different active layers can emit different wavelengths of light, one or more of which can be absorbed and re-emitted by the RE layer.

Each of these LEDs 100, 120, 130, 140, 150, 160, 170, 180 and 190 can also be arranged so that different portions of their active regions can emit light so that the portion of the RE layer aligned with that portion absorbs the light and re-emits another wavelength of light. This arrangement is similar to that in LED 52 shown in FIG. 5 and described above, and is particularly applicable to LEDs 170 and 190 having different RE layer sections. Each of these sections can be aligned with one of the emitting portions of the active region so that emission of one of the emitting portions is primarily absorbed by its aligned RE layer section. Each of the LEDs can also have internal or external mirrors or DBRs to reflect light in the desired direction. For example, LED 100 can have a mirror or DBR adjacent to the substrate 112 to reflect light emitted toward the substrate back toward the RE layer 102.

Figure 18:
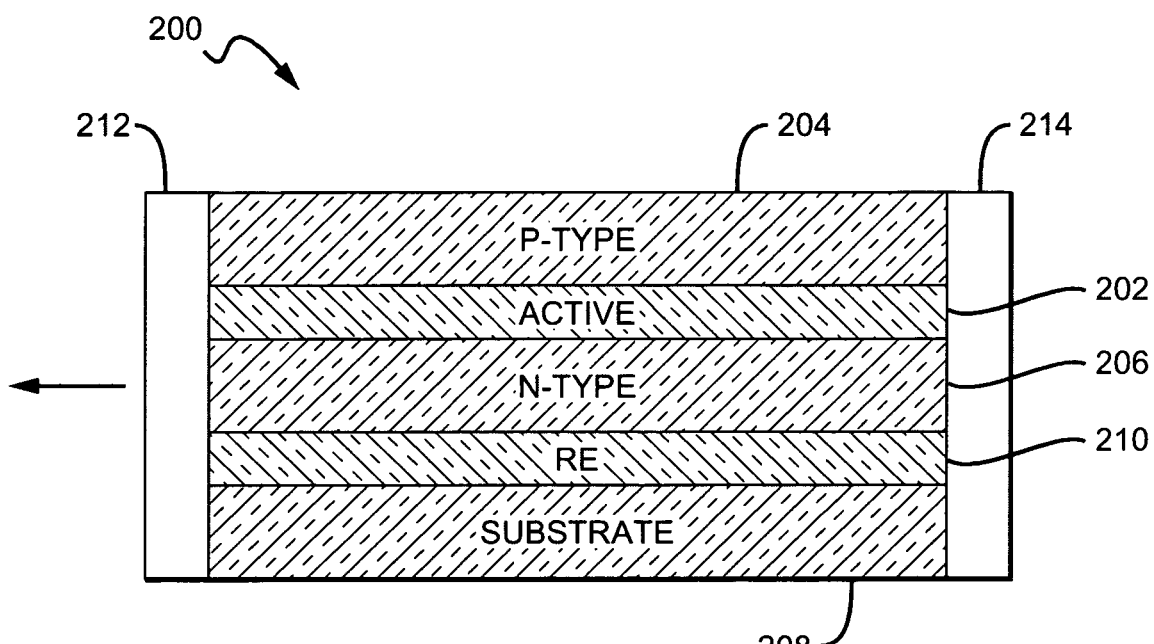
FIG. 18 is a sectional view of one embodiment of a solid state laser according to the present invention having an RE epitaxial layer.

The present invention can also be used with solid state laser such as edge emitting lasers and vertical cavity lasers. FIG. 18 shows a Group-III nitride based edge emitting laser 200 comprising an active region 202 sandwiched between a p-type layer 204 and an n-type layer 206, all of which are grown on a substrate 208. An RE layer 210 is included that can be in different locations in the laser 200, and as shown is between the n-type layer 206 and the substrate 208. In other embodiments it can be on the p-type layer 204. The laser 200 also has mirrors 212, 214 that reflect light between the mirrors with a portion of light emitting through mirror 212, resulting in a highly collimated/coherent light source.

When a bias is applied to the p and n-type layers 204 and 206 through electrical contacts (not shown), the active layer 202 may emit light omnidirectionally and some of the light passes into the RE layer 210. Some or all of the light will be absorbed by the RE elements and re-emits as a different color of light. The light reflects between the mirrors 212 and 214 to produce stimulated LED emission of light from the active region 202 and for the RE layer 210. In one embodiment the active region 202 emits UV light and the RE layer 210 is doped to absorb UV light and re-emit green light. As a result, the laser 200 appears as though it is emitting green light. Depending on the dopant used in the RE layer 210, the color of the emitted light can be different, as described above. The RE layer can similarly be incorporated as part of a vertical cavity laser (not shown) and operates similar to the laser 83 shown in FIG. 8 and described above.

In other laser embodiments according to the present invention, mirror reflectors can be designed to favor one or more colors for lasing in the cavity, with one such color being UV light. The breadth and gain spectrum and degree of population inversion would be different for different wavelengths, which could be utilized to distinguish between the two wavelengths. For example, one could create a near UV laser with very high efficiency mirrors that allow very little near UV light to escape. The RE layers (or phosphors) could be within or at the edge of the wavelength absorbing at the UV wavelength and can re-emit spontaneously in the visible spectrum, with one or many colors. This arrangement can be used in lasers to emit different colors of light, such as a white light.

Figure 19:
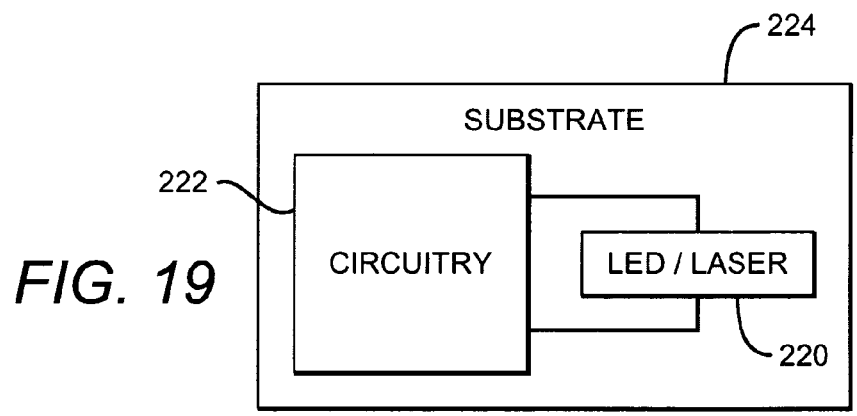
FIG. 19 is a block diagram of the new LED/laser, connected to electrical circuitry.

FIG. 19 shows a LED/laser 220 that can comprise any of the LED/laser embodiments described above or their variations. The LED/laser 220 is connected to electrical circuitry 222 that can perform various functions such as power conversion or conditioning. The circuitry can also control the biases applied to the various contacts on the LEDs described above, to control the colors the LEDs emit. In one embodiment, the electrical circuitry can be on a common substrate 224 with the LED/laser 220.

Although the present invention has been described in considerable detail with reference to certain preferred configurations thereof, other versions are possible. Therefore, the spirit and scope of the appended claims should not be limited to their preferred versions contained therein.

We claim:

1. A solid state light emitting device, comprising:
 a light emitting diode comprising:
  an active region of epitaxial semiconductor material; and
  a pair of oppositely doped layers, both comprising epitaxial semiconductor material on opposite sides of said active region, said active region emitting light at a predetermined wavelength in response to an electrical bias across said doped layers; and
 an absorption layer of epitaxial semiconductor material integral to said light emitting diode and doped with at least one rare earth or transition element, said active region, doped layers and absorption layer arranged directly in succession to one another and on a growth substrate, said absorption layer absorbing at least some of the light emitted from said active region and re-emitting at least one different wavelength of light, wherein said absorption layer comprises a plurality of doped sections, each of said doped sections are doped with a different rare earth or transition element and emitting light in a distinct wavelength range.

2. The emitting device of claim 1, further comprising ohmic metals to contact each of said oppositely doped layers to apply said bias across said doped layers.

3. The light emitting device of claim 2, wherein one of said ohmic metals is on the top one of said oppositely doped layers, said one of said metals having a pattern with openings, said absorption layer arranged within said pattern openings.

4. The emitting device of claim 1, wherein said active region comprises multiple quantum wells, single quantum wells or double heterostructures.

5. The emitting device of claim 1, wherein said absorption layer is doped with at least one element from the group Er, Eu, Pr, Tm, Dy, Ce, Tb, Mn, Co and Cu.

6. The emitting device of claim 1, wherein the light emitting from said device comprises the light emitting from an active region or the light re-emitting from said absorption layer or a combination thereof.

7. The emitting device of claim 1, wherein said active region comprises a plurality of active layers emitting light at a predetermined wavelength in response to a bias, said absorption layer absorbing at least some of said light from at least one of said active layers and re-emits light at a different wavelength.

8. The emitting device of claim 7, wherein said active layers emit blue, green and UV light and said absorption layer absorbing said UV light and re-emitting a different wavelength of light, said LED emits blue, green, UV and said re-emitted light when all said active layers are emitting.

9. The emitting device of claim 1, wherein said active region emits one wavelength of light, said absorption layer doped throughout with more than one rare earth or transition element such that said absorption layer absorbs at least some of said active region light and re-emits a wavelength combination of more than one wavelength of light.

10. The emitting device of claim 1, comprising a solid state laser and further comprising mirrors on opposing surfaces, said light from said active region and said light absorbed and re-emitted by said absorption layer reflected between said mirrors to achieve stimulated emission.

11. The emitting device of claim 10, wherein said mirrors favor one or more colors for achieving stimulated emission.

12. The emitting device of claim 10, comprising a near UV laser with mirrors allowing substantially no near UV light to escape, said absorption layer within or at the edge of absorbing at the UV wavelength and re-emitting one or many colors spontaneously in the visible spectrum.

13. The emitting device of claim 1, further comprising electrical circuitry integrated with said device on a common substrate.

14. The emitting device of claim 13, wherein said reflector comprises a Distributed Bragg reflector.

15. The emitting device of claim 1, further comprising a reflector to reflect one or both of said light emitted from said active region or said re-emitted light, said reflector integral to said emitting device.

16. The emitting device of claim 1, wherein said absorption layer is doped to give said absorption layer conductive characteristics.

17. The emitting device of claim 1, wherein said absorption layer comprises quantum dots.

18. A solid state light emitting device, comprising:
an emitter structure on a substrate, said emitter structure comprising:
an active region of semiconductor material;
a pair of oppositely doped layers of semiconductor material on opposite sides of said active region, said active region emitting light at a predetermined wavelength in response to an electrical bias across said doped layers;
a plurality of ohmic metals on said oppositely doped layers to apply said bias to said active region, wherein said bias is locally concentrated and said active region emits light primarily below the respective said ohmic metals; and
an absorption layer of semiconductor material integral to said emitter structure and doped with at least one rare earth or transition element, said absorption layer absorbing at least some of the light emitted from said active region and re-emitting at least one different wavelength of light, said absorption layer further comprising a plurality of layer sections each of which is doped with one or more rare earth or transition elements in a different concentration or combination than the others of said layer sections, said ohmic metals aligned with said plurality of layer sections such that one or more portions of said active region emits light that will be primarily absorbed by its aligned one of said plurality of layer sections and re-emitted as a different color.

19. The emitting device of claim 18, wherein said absorption layer is on said emitting structure with said emitting structure between a substrate and said absorbing layer.

20. The emitting device of claim 18, wherein said absorption layer is between said emitting structure and a substrate.

21. The emitting device of claim 18, comprising a light emitting diode (LED), said active layer emitting UV light and said absorption layer absorbing at least some of said UV light and re-emitting at least one different color of light.

22. The emitting device of claim 18, comprising a light emitting diode (LED), said active layer emitting blue light and said absorption layer absorbing at least some of said blue light and re-emitting at least one different color of light.

23. The emitting device of claim 18, said active region aligned with each of said layer sections.

24. A solid state light emitting device, comprising:
a light emitting diode comprising;
an active region of epitaxial semiconductor material;
a pair of oppositely doped layers, both comprising epitaxial semiconductor material on opposite sides of said active region, said active region emitting light at a predetermined wavelength in response to an electrical bias across said doped layers; and
an absorption layer of epitaxial semiconductor material integral to said light emitting diode and doped with at least one rare earth or transition element, said active region, doped layers and absorption layer arranged directly in succession to one another and on a growth substrate, said absorption layer absorbing at least some of the light emitted from said active region and re-emitting at least one different wavelength of light, wherein said absorption layer comprises a plurality of layers of semiconductor materials, each of which is doped with one or more rare earth transition elements in a different combination or concentration than the others of said plurality of layers.

* * * * *